United States Patent
Lam et al.

(10) Patent No.: US 10,128,831 B1
(45) Date of Patent: Nov. 13, 2018

(54) APPARATUS, SYSTEM, AND METHOD FOR ENSURING RELIABLE INITIALIZATION CONDITIONS IN RESPONSE TO EXTERNAL RESET SIGNALS

(71) Applicant: Juniper Networks, Inc., Sunnyvale, CA (US)

(72) Inventors: Ronald Lam, Fremont, CA (US); Jaspal S. Gill, Tracy, CA (US); Martin D. Lavoie, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/425,786

(22) Filed: Feb. 6, 2017

(51) Int. Cl.
*H03L 3/00* (2006.01)
*H03K 17/22* (2006.01)

(52) U.S. Cl.
CPC .................. *H03K 17/223* (2013.01)

(58) Field of Classification Search
CPC .................................... H03K 17/223
USPC .................................. 327/140–144
See application file for complete search history.

(56) References Cited

U.S. PATENT DOCUMENTS

| | | | | |
|---|---|---|---|---|
| 4,536,667 A | * | 8/1985 | Masuda | H03K 17/22 327/143 |
| 5,381,296 A | * | 1/1995 | Ekelund | H02H 3/087 361/106 |
| 5,760,625 A | * | 6/1998 | Macks | G06F 1/24 327/143 |
| 6,259,287 B1 | * | 7/2001 | Macks | G05F 1/575 327/143 |
| 7,683,686 B2 | * | 3/2010 | Wang | G06F 1/20 327/142 |

FOREIGN PATENT DOCUMENTS

JP          60017521 A    *   1/1985

\* cited by examiner

*Primary Examiner* — Dinh T Le
(74) *Attorney, Agent, or Firm* — FisherBroyles, LLP

(57) ABSTRACT

The disclosed apparatus may include (1) a first transistor whose (A) first terminal is electrically coupled to an enable node, (B) second terminal is electrically coupled to a feedback node, and (C) third terminal is electrically coupled to a ground node, (2) a second transistor whose (A) first terminal is electrically coupled to the feedback node, (B) second terminal is electrically coupled to the enable node, and (C) third terminal is electrically coupled to the ground node, (3) a resistor that is electrically coupled between the feedback node and the ground node, and (4) a diode that is electrically coupled between the feedback node and another resistor, wherein the other resistor is electrically coupled between the diode and an output-voltage node that provides electrical power to a computing device. Various other apparatuses, systems, and methods are also disclosed.

20 Claims, 5 Drawing Sheets

US 10,128,831 B1

APPARATUS, SYSTEM, AND METHOD FOR ENSURING RELIABLE INITIALIZATION CONDITIONS IN RESPONSE TO EXTERNAL RESET SIGNALS

BACKGROUND

Reset circuitry often enables users to reset computing devices with the press of a button or other user input. By pressing a button or entering other user input, a user may cause the reset circuitry to switch the state of a reset signal. In response to this switch, the reset circuitry may prevent power from reaching the rest of the computing device until the reset signal switches back to the previous state.

Unfortunately, conventional reset circuitry may have certain shortcomings and/or deficiencies that enable the reset signal to switch back to the previous state before certain initialization conditions have been met. In other words, these shortcomings and/or deficiencies may enable the computing device to power up again too soon. For example, circuit engineers may design a reset circuit to hold the power off for 1.5 seconds via a Resistor-Capacitor (RC) timer in response to an external reset signal. However, due to certain variances and/or tolerances of the components used in the RC timer, the reset circuit may allow the power to be restored before the 1.5 second threshold in certain cases, thereby failing to guarantee that the initialization conditions have been met during a reset operation.

The instant disclosure, therefore, identifies and addresses a need for additional and improved apparatuses, systems, and methods for ensuring reliable initialization conditions in response to external reset signals.

SUMMARY

As will be described in greater detail below, the instant disclosure generally relates to apparatuses, systems, and methods for ensuring reliable initialization conditions in response to external reset signals. In one example, an apparatus for accomplishing such a task may include (1) a first transistor whose (A) first terminal is electrically coupled to an enable node, (B) second terminal is electrically coupled to a feedback node, and (C) third terminal is electrically coupled to a ground node, (2) a second transistor whose (A) first terminal is electrically coupled to the feedback node, (B) second terminal is electrically coupled to the enable node, and (C) third terminal is electrically coupled to the ground node, (3) a resistor that is electrically coupled between the feedback node and the ground node, and (4) a diode that is electrically coupled between the feedback node and another resistor, wherein the other resistor is electrically coupled between the diode and an output-voltage node that provides electrical power to a computing device.

Similarly, a network device incorporating the above-described apparatus may include (1) a first transistor whose (A) first terminal is electrically coupled to an enable node, (B) second terminal is electrically coupled to a feedback node, and (C) third terminal is electrically coupled to a ground node, (2) a second transistor whose (A) first terminal is electrically coupled to the feedback node, (B) second terminal is electrically coupled to the enable node, and (C) third terminal is electrically coupled to the ground node, (3) a resistor that is electrically coupled between the feedback node and the ground node, and (4) a diode that is electrically coupled between the feedback node and another resistor, wherein the other resistor is electrically coupled between the diode and an output-voltage node that provides electrical power to a computing device.

A corresponding method may include (1) electrically coupling (A) a first terminal of a first transistor to an enable node, (B) a second terminal of the first transistor to a feedback node, and (C) a third terminal of the first transistor to a ground node, (2) electrically coupling (A) a first terminal of a second transistor to the feedback node, (B) a second terminal of the second transistor to the enable node, and (C) a third terminal of the second transistor to the ground node, (3) electrically coupling a resistor between the feedback node and the ground node, and (4) electrically coupling a diode between the feedback node and another resistor, wherein the other resistor is electrically coupled between the diode and an output-voltage node that provides electrical power to a computing device.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
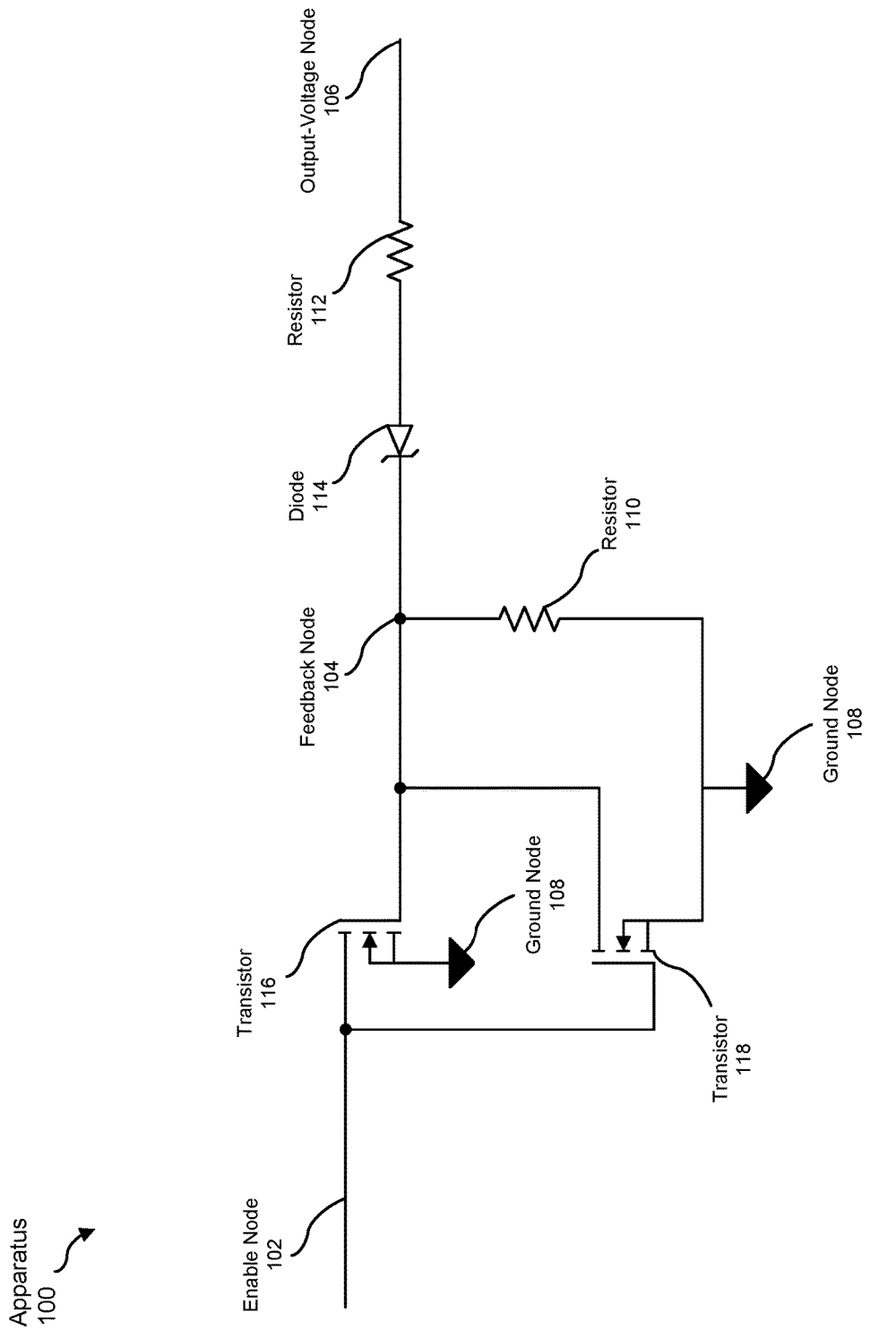
FIG. 1 is a block diagram of an exemplary apparatus for ensuring reliable initialization conditions in response to external reset signals.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for ensuring reliable initialization conditions in response to external reset signals. As will be explained in greater detail below, embodiments of the instant disclosure may power down a computing device in response to a reset signal. As the computing device powers down, the output voltage provided to the computing device may decrease and/or decay. In order to ensure reliable initialization conditions for the computing device, the output-voltage level may need to reach a certain lower limit or threshold. Accordingly, embodiments of the instant disclosure may ensure that the reliable initialization conditions are achieved by holding off the power until the output-voltage level has reached that lower limit or threshold.

Figure 2:
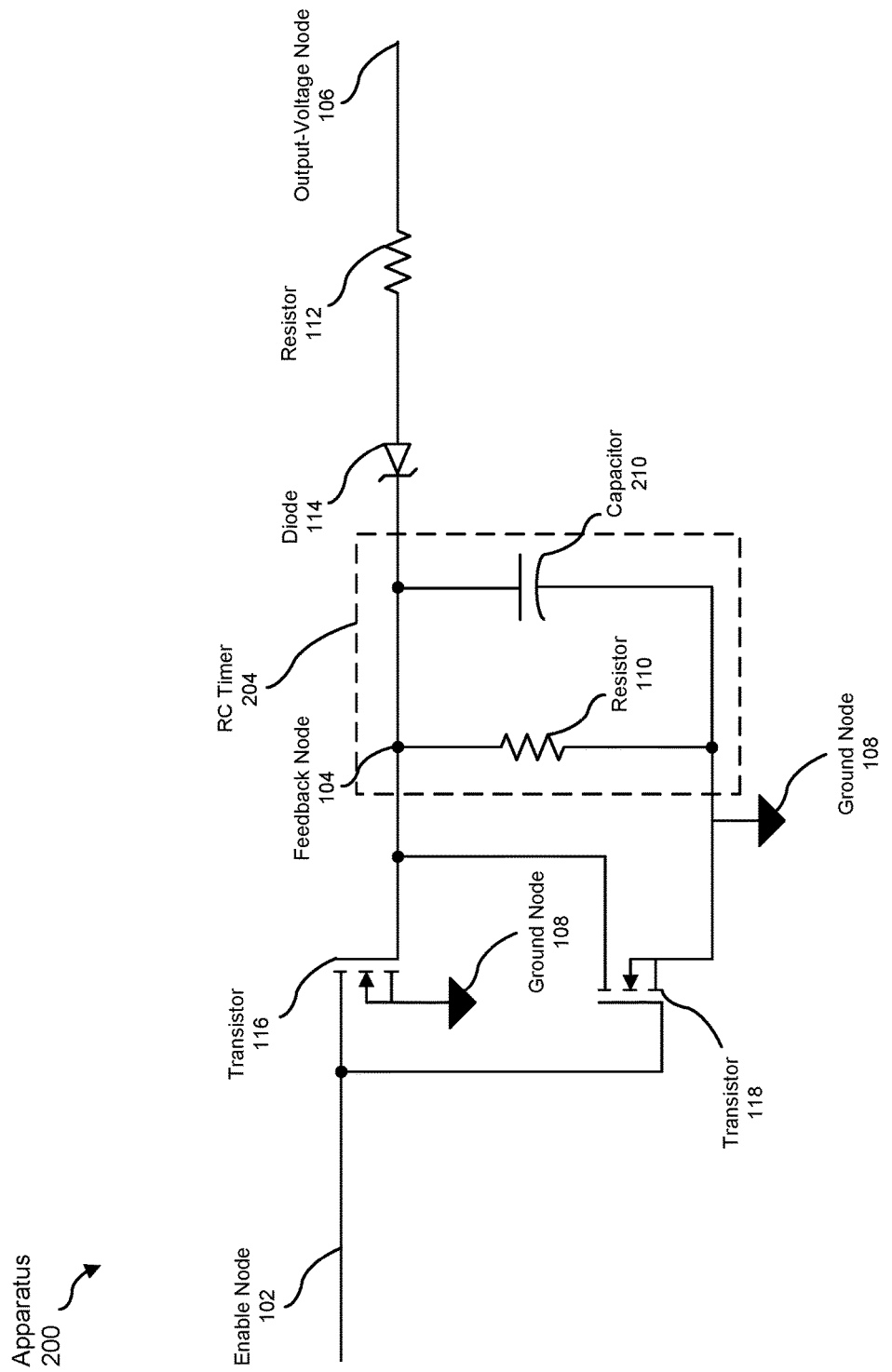
FIG. 2 is a block diagram of an exemplary apparatus for ensuring reliable initialization conditions in response to external reset signals.

The following will provide, with reference to FIGS. 1 and 2, examples of apparatuses and corresponding implementations for ensuring reliable initialization conditions in response to external reset signals. The discussion corresponding to FIG. 3 will provide a detailed description of exemplary waveforms that represent signals generated by an apparatus for ensuring reliable initialization conditions in response to external reset signals. The discussion corresponding to FIG. 4 will provide a detailed description of an exemplary method for ensuring reliable initialization conditions in response to external reset signals. Finally, the discussion corresponding to FIG. 5 will provide numerous examples of systems that may include the components and/or circuits shown in FIG. 1 or 2.

FIG. 1 shows an exemplary apparatus 100 for ensuring reliable initialization conditions in response to external reset signals. As illustrated in FIG. 1, apparatus 100 may include and/or represent a transistor 116, a transistor 118, a resistor 110, a resistor 112, and a diode 114. The term "transistor," as used herein, generally refers to any type or form of semiconductor device that amplifies and/or switches electronic signals and/or electrical power within a circuit. Examples of transistors 116 and 118 include, without limitation, Field Effect Transistors (FETs), Metal Oxide Semiconductor FETs (MOSFETs), bipolar junction transistors (BJTs), NPN transistors, PNP transistors, variations or combinations of one or more of the same, and/or any other suitable transistors.

The term "resistor," as used herein, generally refers to any type or form of passive electrical component that implements electrical resistance within a circuit. Examples of resistors 110 and 112 include, without limitation, carbon resistors, film resistors, metal film resistors, wirewound resistors, variations or combinations of one or more of the same, and/or any other suitable resistors.

The term "diode," as used herein, generally refers to any type or form of electrical component that conducts electrical current primarily in one direction. Examples of diode 114 include, without limitation, junction diodes, Schottky diodes, Light Emitting Diodes (LEDs), Zener diodes, avalanche diodes, PIN diodes, variations or combinations of one or more of the same, and/or any other suitable resistors.

As illustrated in FIG. 1, apparatus 100 may also include an enable node 102, a feedback node 104, a ground node 108, and an output-voltage node 106. In one example, enable node 102 may carry and/or provide an enable or reset signal that, in one state, enables apparatus 100 to output power to a computing device and, in another state, prevents apparatus 100 from outputting power to the computing device. In addition, output-voltage node 106 may carry and/or provide the output voltage and/or electrical power to the computing device.

As illustrated in FIG. 1, transistor 116 may include a first terminal that is electrically coupled to enable node 102, a second terminal that is electrically coupled to feedback node 104, and a third terminal that is electrically coupled to ground node 108. Similarly, transistor 118 may include a first terminal that is electrically coupled to feedback node 104, a second terminal that is electrically coupled to enable node 102, and a third terminal that is electrically coupled to ground node 108. In addition, resistor 110 may be electrically coupled between feedback node 104 and ground node 108, and diode 114 may be electrically coupled between feedback node 104 and resistor 112. In this example, resistor 112 may be electrically coupled between diode 114 and output-voltage node 106 that provides electrical power to the computing device.

In some examples, transistors 116 and 118 may each include at least 3 electrical terminals and/or leads that facilitate connections to certain nodes and/or components within a circuit. In one example, transistors 116 and 118 may each represent a MOSFET. In this example, transistor 116 may include a gate that is electrically coupled to enable node 102, a drain that is electrically coupled to feedback node 104, and a source that is electrically coupled to ground node 108. Similarly, transistor 118 may include a gate that is electrically coupled to feedback node 104, a drain that is electrically coupled to enable node 102, and a source that is electrically coupled to ground node 108.

In another example, transistors 116 and 118 may each represent a BJT. In this example, transistor 116 may include a base that is electrically coupled to enable node 102, a collector that is electrically coupled to feedback node 104, and an emitter that is electrically coupled to ground node 108. Similarly, transistor 118 may include a base that is electrically coupled to feedback node 104, a collector that is electrically coupled to enable node 102, and an emitter that is electrically coupled to ground node 108. Accordingly, the gate, drain, and source terminals of a MOSFET may approximately correspond to the base, collector, and emitter terminals of a BJT.

In some examples, apparatus 100 may include and/or represent a power-reset circuit on a computing device. In such examples, the power-reset circuit may be incorporated in a front-end power supply of the computing device, a Direct Current-to-Direct Current (DC-to-DC) converter of the computing device, or a hot swap device of the computing device. Examples of this computing device include, without limitation, network devices, routers, switches, hubs, modems, bridges, repeaters, gateways, load balancers, multiplexers, network adapters, servers, client devices, laptops, tablets, desktops, servers, cellular phones, Personal Digital Assistants (PDAs), multimedia players, embedded systems, wearable devices, gaming consoles, variations or combinations of one or more of the same, and/or any other suitable computing device.

In one example, a user of the computing device may initiate a reboot or restart sequence. As part of the reboot or restart sequence, the user may press a button that causes an enable or reset signal on enable node 102 to switch states. For example, by pressing a button, the user may cause the enable or reset signal to switch from a logic high state to a logic low state. In this example, the logic high state may enable apparatus 100 to provide and/or feed electrical power to the rest of the computing device. In contrast, the logic low state may prevent apparatus 100 from providing and/or feeding electrical power to the rest of the computing device.

Additionally or alternatively, the computing device may initiate its own reboot or restart sequence. As part of the reboot or restart sequence, the computing device may cause the enable or reset signal to switch from a logic low state to a logic high state. In this example, the logic low state may enable apparatus 100 to provide and/or feed electrical power to the rest of the computing device. In contrast, the logic high state may prevent apparatus 100 from providing and/or feeding electrical power to the rest of the computing device.

In some examples, the power-reset circuit of apparatus 100 may be designed to monitor and/or rely on the voltage level on output-voltage node 106 as a feedback signal that indicates whether the reliable initialization conditions have been met and/or satisfied. For example, the power-reset circuit may be designed and/or configured to prevent electrical power from being provided and/or fed to the computing device until the voltage level on output-voltage node 106 has decreased and/or decayed to a certain threshold. In this example, the threshold may correspond to the reliable initialization conditions having been met.

In some examples, the threshold may vary to accommodate the needs of a particular system and/or computing device. In other words, the power-reset circuit may be designed and/or configured to prevent power from being restored to a particular computing device until the voltage level on output-voltage node 106 has dropped to a threshold that meets the needs of that computing device. In one example, the designers of the power-reset circuit may select resistance values for resistors 110 and 112 that ensure that the voltage level on output-voltage node 106 drops to a certain threshold before electrical power is fully restored to the computing device.

In one example, the voltage level on output-voltage node 106 may remain at or around 12 volts while the computing device is powered on and operational. In this example, in response to a reset signal, the power-reset circuit may shut off the electrical power to the computing device and then prevent electrical power from being restored to the computing device until the voltage level on output-voltage node 106 drops to and/or reaches 0.3 volts. Once the voltage level on output-voltage node 106 drops to and/or reaches 0.3 volts, the power-reset circuit may restore electrical power to the computing device by switching back the enable or reset signal and returning the voltage level on output-voltage node 106 to 12 volts such that the computing device is able to function properly again.

FIG. 2 shows an exemplary apparatus 200 for ensuring reliable initialization conditions in response to external reset signals. As illustrated in FIG. 2, apparatus 200 may include all of the components from apparatus 100. In addition to those components from apparatus 100, apparatus 200 may also include a capacitor 210. This addition of capacitor 210 to the power-reset circuit may form an RC timer 204 with resistor 110. In other words, the combination of resistor 110 and capacitor 210 in parallel with one another between feedback node 104 and ground node 108 may form RC timer 204. As will be explained in greater detail below, RC timer 204 may effectively add another safeguard against restoring electrical power to the computing device too soon.

In some examples, capacitor 210 may build up a charge as the electrical power delivered to the computing device is switched off. In these examples, in response to a reset signal, the power-reset circuit may shut off the electrical power to the computing device, and the resulting change in voltage at feedback node 104 may charge up capacitor 210. The power-reset circuit may then prevent electrical power from being restored to the computing device until the voltage level on output-voltage node 106 drops to and/or reaches 0.3 volts and RC timer 204 expires. In other words, even in the event that the voltage level on voltage node 106 drops to and/or reaches 0.3 volts, the power-reset circuit may hold off the power from the computing device until RC timer 204 has decreased and/or decayed to a certain threshold.

As an example, the threshold for RC timer 204 may be designed and/or configured at 2.5 volts. In this example, the power-reset circuit may shut off and/or keep off the electrical power until the voltage level on output-voltage node 106 drops to and/or reaches 0.3 volts and RC timer 204 decreases and/or decays to 2.5 volts. RC timer 204 may be measured and/or represented at feedback node 104. Once the voltage level on output-voltage node 106 drops to and/or reaches 0.3 volts and RC timer 204 expires, the power-reset circuit may restore electrical power to the computing device by switching back the enable or reset signal and returning the voltage level on output-voltage node 106 to 12 volts such that the computing device is able to function properly again.

Figure 3:
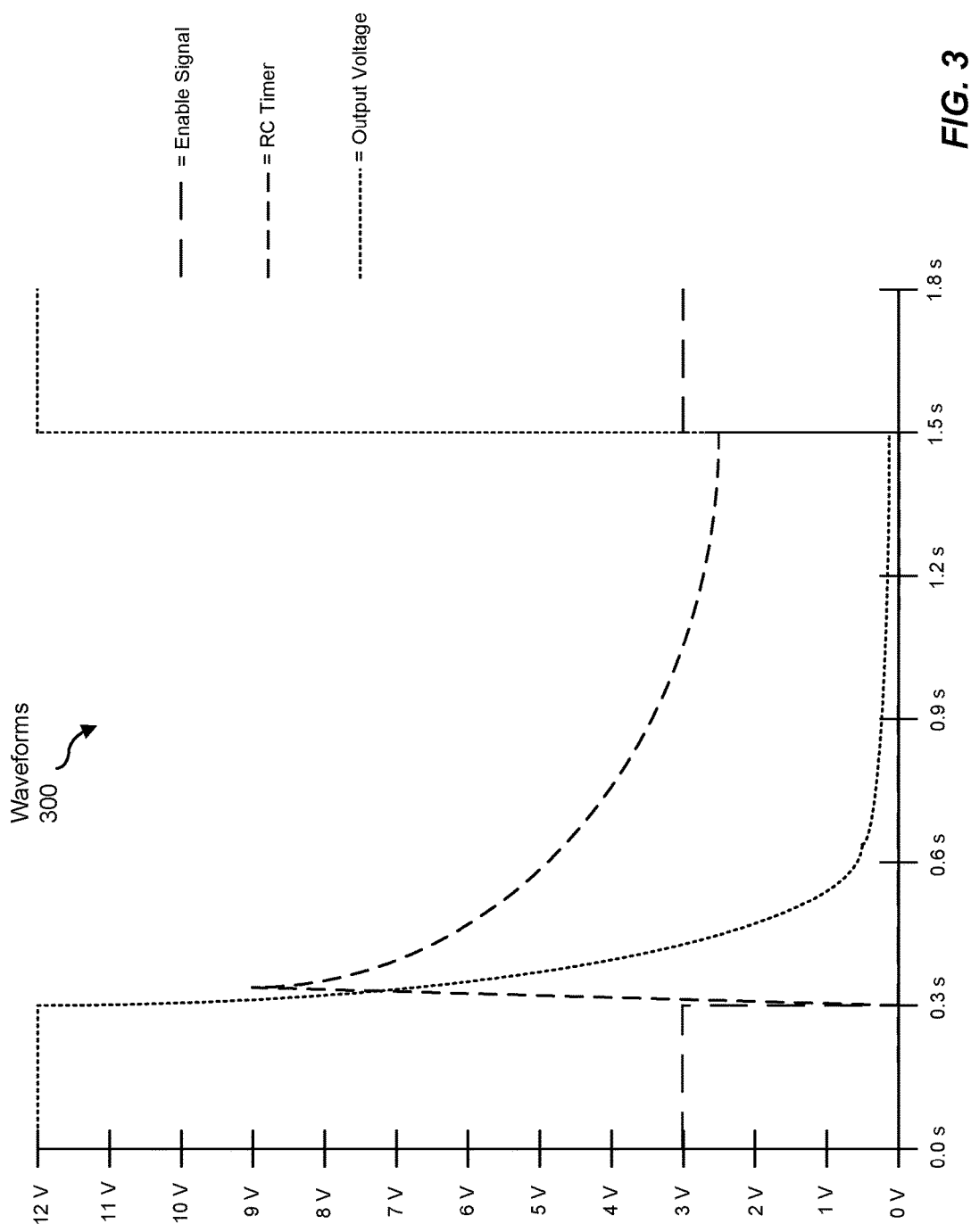
FIG. 3 is an illustration of exemplary waveforms that represent signals generated by an apparatus for ensuring reliable initialization conditions in response to external reset signals.

FIG. 3 shows exemplary waveforms 300 that represent signals generated by apparatus 100 for ensuring reliable initialization conditions in response to external reset signals. As illustrated in FIG. 3, waveforms 300 may include an enable signal that is initially maintained at a logic high (3 volts) from 0 to 0.3 seconds. In this example, the enable signal may be carried by enable node 102. At 0.3 seconds, the enable signal may then switch from logic high to logic low (0 volts) and be maintained at logic low from 0.3 to 1.5 seconds. At 1.5 seconds, the enable signal may switch back to logic high.

As illustrated in FIG. 3, waveforms 300 may also include an RC timer signal that is initially maintained at 0 volts from 0 to 0.3 seconds when the enable signal switches from logic high to logic low. In this example, the RC timer signal may be carried by feedback node 104. In response to the enable signal's switch to logic low, the RC timer signal may spike up from 0 volts to 9 volts as the capacitor in the RC timer charges due to the change in the output voltage caused by the enable signal's switch to logic low. The RC timer signal may then decrease and/or decay from 9 volts at 0.4 seconds to 2.5 volts at 1.5 seconds. In this example, 2.5 volts may represent the threshold at which the RC timer signal expires.

As illustrated in FIG. 3, waveforms 300 may further include an output voltage that is initially maintained at 12 volts from 0 to 0.3 seconds when the enable signal switches from logic high to logic low. In this example, the output voltage may be carried by output-voltage node 106. In response to the enable signal's switch to logic low, the output voltage signal may decrease and/or decay from 12 volts at 0.3 seconds to 0.3 volts at 1.5 seconds. In this example, 0.3 volts may represent the threshold at which the reliable initialization conditions have been achieved. Accordingly, since the output voltage has reached the 0.3-volt threshold at the 1.5 second mark and the RC timer has expired at the 1.5 second mark, the output voltage may return to 12 volts and power on the computing device again.

Figure 4:
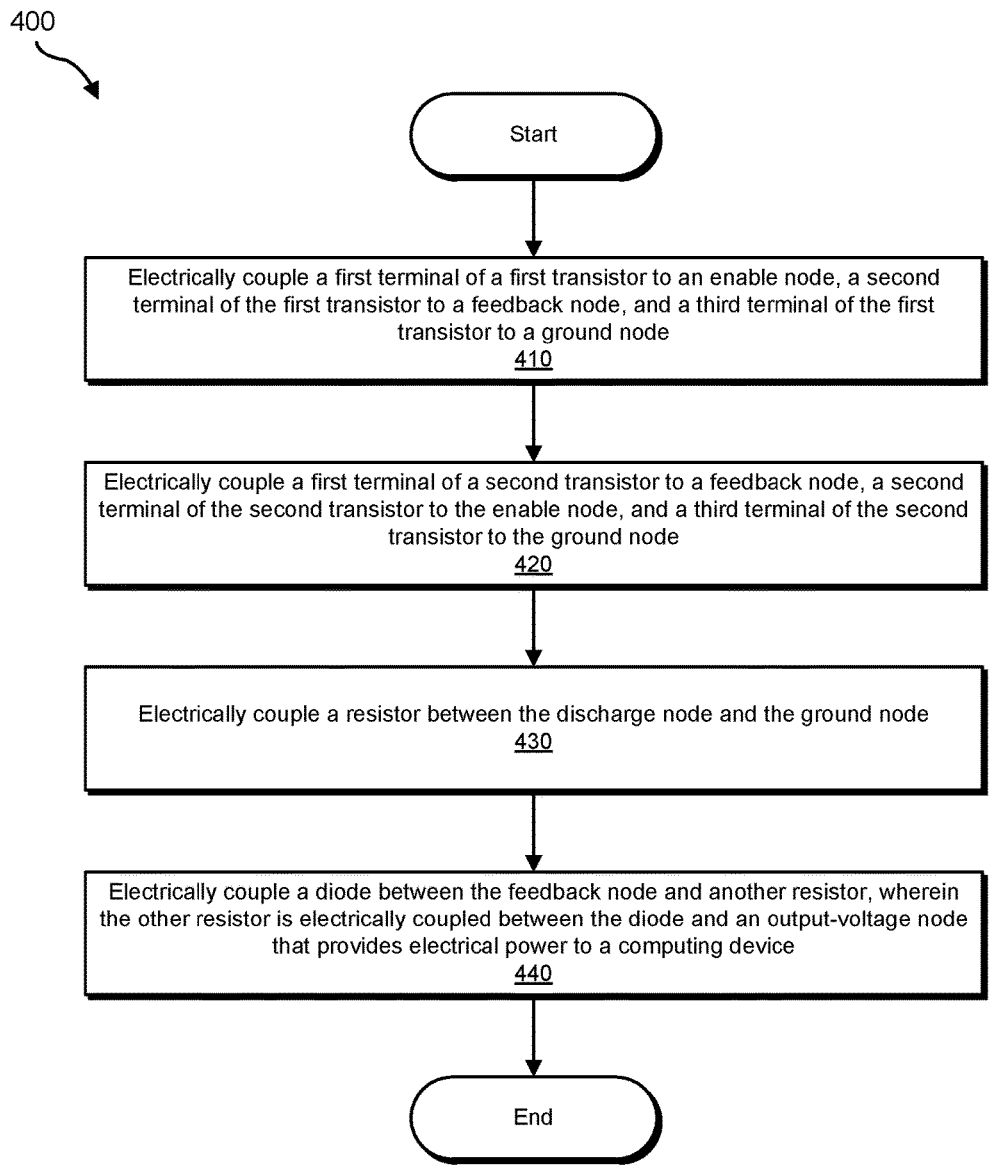
FIG. 4 is a flow diagram of an exemplary method for ensuring reliable initialization conditions in response to external reset signals.

FIG. 4 is a flow diagram of an exemplary method 400 for ensuring reliable initialization conditions in response to external reset signals. Method 400 may include the step of electrically coupling a first terminal of a first transistor to an enable node, a second terminal of the first transistor to a feedback node, and a third terminal of the first transistor to a ground node (410). This electrically coupling step may be performed in a variety of ways. For example, a telecommunications equipment manufacturer may manufacture a printed circuit board (PCB) for a telecommunications device. When manufacturing the PCB, the telecommunications equipment manufacturer may assemble the telecommunications device by physically connecting the gate of the first transistor to the enable node, the drain of the first transistor to the feedback node, and the source of the first transistor to the ground node.

Returning to FIG. 4, method 400 may also include the step of electrically coupling a first terminal of a second transistor to the feedback node, a second terminal of the first transistor to the enable node, and a third terminal of the first transistor to the ground node (420). This electrically coupling step may be performed in a variety of ways. For example, when manufacturing the PCB, the telecommunications equipment manufacturer may assemble the telecommunications device by physically connecting the gate of the second transistor to the feedback node, the drain of the first transistor to the enable node, and the source of the first transistor to the ground node.

Returning to FIG. 4, method 400 may further include the step of electrically coupling a resistor between the feedback node and the ground node (430). This electrically coupling step may be performed in a variety of ways. For example, when manufacturing the PCB, the telecommunications equipment manufacturer may assemble the telecommunications device by physically connecting a resistor between the feedback node and the ground node.

Returning to FIG. 4, method 400 may additionally include the step of electrically coupling a diode between the feedback node and another resistor, wherein the other resistor is electrically coupled between the diode and an output-voltage node that provides electrical power to a computing device (440). This electrically coupling step may be performed in a variety of ways. For example, when manufacturing the PCB, the telecommunications equipment manufacturer may assemble the telecommunications device by physically connecting a diode between the feedback node and another resistor. In addition, the telecommunications equipment manufacturer may physically connect the other resistor between the diode and the output-voltage node that provides electrical power to the computing device.

Figure 5:
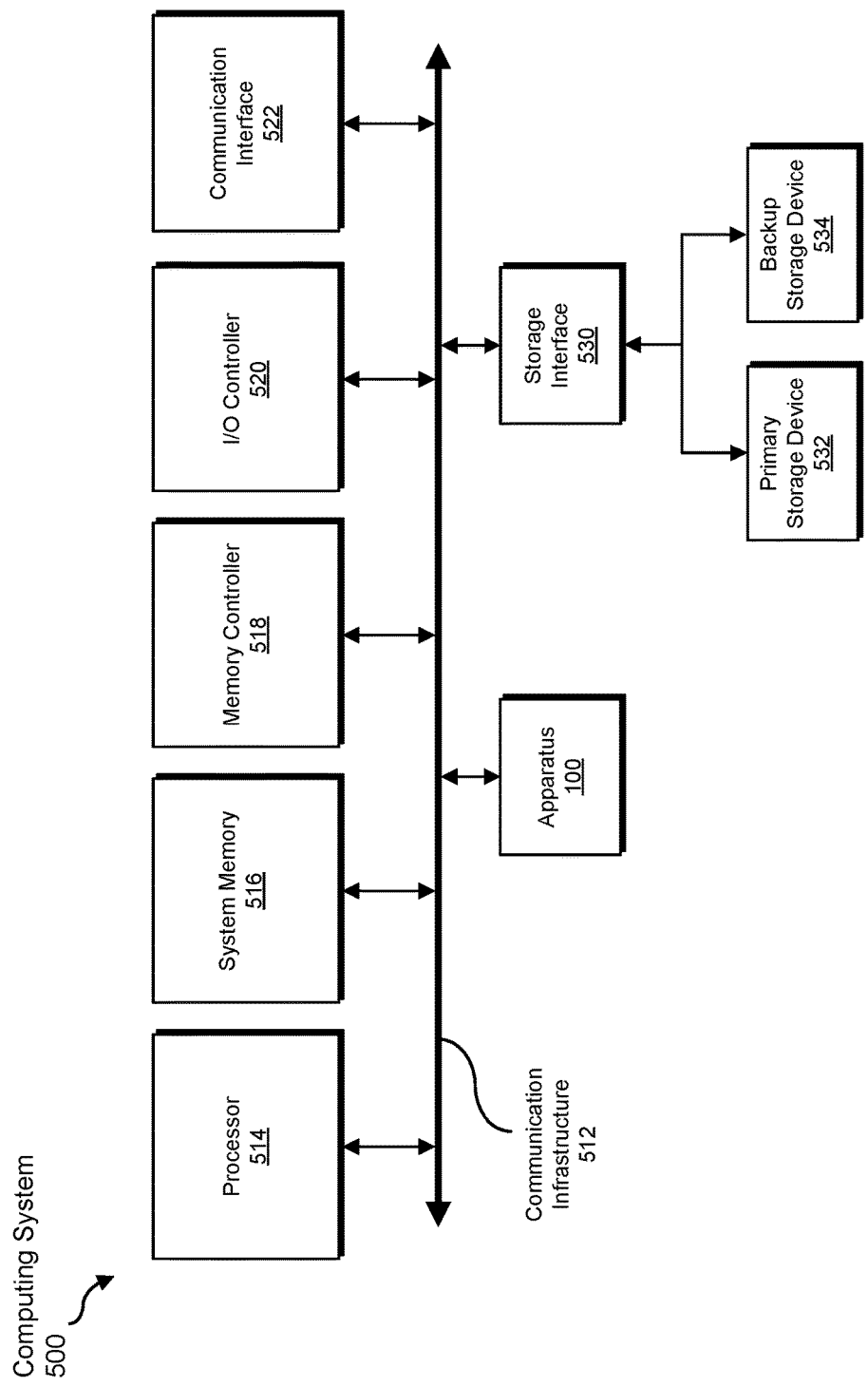
FIG. 5 is a block diagram of an exemplary computing system capable of implementing and/or being used in connection with one or more of the embodiments described and/or illustrated herein.

FIG. 5 is a block diagram of an exemplary computing system 500 capable of implementing and/or being used in connection with one or more of the embodiments described and/or illustrated herein. In some embodiments, all or a portion of computing system 500 may perform and/or be a means for performing, either alone or in combination with other elements, one or more of the steps described in connection with FIG. 7. All or a portion of computing system 500 may also perform and/or be a means for performing and/or implementing any other steps, methods, or processes described and/or illustrated herein. In one example, computing system 500 may include apparatus 100 from FIG. 1.

Computing system 500 broadly represents any type or form of electrical load, including a single or multi-processor computing device or system capable of executing computer-readable instructions. Examples of computing system 500 include, without limitation, workstations, laptops, client-side terminals, servers, distributed computing systems, mobile devices, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), and/or any other type or form of computing system or device.

Computing system 500 may be programmed, configured, and/or otherwise designed to comply with one or more networking protocols. According to certain embodiments, computing system 500 may be designed to work with protocols of one or more layers of the Open Systems Interconnection (OSI) reference model, such as a physical layer protocol, a link layer protocol, a network layer protocol, a transport layer protocol, a session layer protocol, a presentation layer protocol, and/or an application layer protocol. For example, computing system 500 may include a network device configured according to a Universal Serial Bus (USB) protocol, an Institute of Electrical and Electronics Engineers (IEEE) 1394 protocol, an Ethernet protocol, a T1 protocol, a Synchronous Optical Networking (SONET) protocol, a Synchronous Digital Hierarchy (SDH) protocol, an Integrated Services Digital Network (ISDN) protocol, an Asynchronous Transfer Mode (ATM) protocol, a Point-to-Point Protocol (PPP), a Point-to-Point Protocol over Ethernet (PPPoE), a Point-to-Point Protocol over ATM (PPPoA), a Bluetooth protocol, an IEEE 802.XX protocol, a frame relay protocol, a token ring protocol, a spanning tree protocol, and/or any other suitable protocol.

Computing system 500 may include various network and/or computing components. For example, computing system 500 may include at least one processor 514 and a system memory 516. Processor 514 generally represents any type or form of processing unit capable of processing data or interpreting and executing instructions. For example, processor 514 may represent an application-specific integrated circuit (ASIC), a system on a chip (e.g., a network processor), a hardware accelerator, a general purpose processor, and/or any other suitable processing element.

Processor 514 may process data according to one or more of the networking protocols discussed above. For example, processor 514 may execute or implement a portion of a protocol stack, may process packets, may perform memory operations (e.g., queuing packets for later processing), may execute end-user applications, and/or may perform any other processing tasks.

System memory 516 generally represents any type or form of volatile or non-volatile storage device or medium capable of storing data and/or other computer-readable instructions. Examples of system memory 516 include, without limitation, Random Access Memory (RAM), Read Only Memory (ROM), flash memory, or any other suitable memory device. Although not required, in certain embodiments computing system 500 may include both a volatile memory unit (such as, for example, system memory 516) and a non-volatile storage device (such as, for example, primary storage device 532, as described in detail below). System memory 516 may be implemented as shared memory and/or distributed memory in a network device. Furthermore, system memory 516 may store packets and/or other information used in networking operations.

In certain embodiments, exemplary computing system 500 may also include one or more components or elements in addition to processor 514 and system memory 516. For example, as illustrated in FIG. 5, computing system 500 may include a memory controller 518, an Input/Output (I/O) controller 520, and a communication interface 522, each of which may be interconnected via communication infrastructure 512. Communication infrastructure 512 generally represents any type or form of infrastructure capable of facilitating communication between one or more components of a computing device. Examples of communication infrastructure 512 include, without limitation, a communication bus (such as a Serial ATA (SATA), an Industry Standard Architecture (ISA), a Peripheral Component Interconnect (PCI), a PCI Express (PCIe), and/or any other suitable bus), and a network.

Memory controller 518 generally represents any type or form of device capable of handling memory or data or controlling communication between one or more components of computing system 500. For example, in certain embodiments memory controller 518 may control communication between processor 514, system memory 516, and I/O controller 520 via communication infrastructure 512. In some embodiments, memory controller 518 may include a Direct Memory Access (DMA) unit that may transfer data (e.g., packets) to or from a link adapter.

I/O controller 520 generally represents any type or form of device or module capable of coordinating and/or controlling the input and output functions of a computing device. For example, in certain embodiments I/O controller 520 may control or facilitate transfer of data between one or more elements of computing system 500, such as processor 514, system memory 516, communication interface 522, and storage interface 530.

Communication interface 522 broadly represents any type or form of communication device or adapter capable of facilitating communication between exemplary computing system 500 and one or more additional devices. For example, in certain embodiments communication interface 522 may facilitate communication between computing system 500 and a private or public network including additional computing systems. Examples of communication interface 522 include, without limitation, a link adapter, a wired network interface (such as a network interface card), a wireless network interface (such as a wireless network interface card), and any other suitable interface. In at least one embodiment, communication interface 522 may provide a direct connection to a remote server via a direct link to a network, such as the Internet. Communication interface 522 may also indirectly provide such a connection through, for example, a local area network (such as an Ethernet network), a personal area network, a wide area network, a private network (e.g., a virtual private network), a telephone or cable network, a cellular telephone connection, a satellite data connection, or any other suitable connection.

In certain embodiments, communication interface 522 may also represent a host adapter configured to facilitate communication between computing system 500 and one or more additional network or storage devices via an external bus or communications channel. Examples of host adapters include, without limitation, Small Computer System Interface (SCSI) host adapters, Universal Serial Bus (USB) host adapters, IEEE 1394 host adapters, Advanced Technology Attachment (ATA), Parallel ATA (PATA), Serial ATA (SATA), and External SATA (eSATA) host adapters, Fibre Channel interface adapters, Ethernet adapters, or the like. Communication interface 522 may also enable computing system 500 to engage in distributed or remote computing. For example, communication interface 522 may receive instructions from a remote device or send instructions to a remote device for execution.

As illustrated in FIG. 5, exemplary computing system 500 may also include a primary storage device 532 and/or a backup storage device 534 coupled to communication infrastructure 512 via a storage interface 530. Storage devices 532 and 534 generally represent any type or form of storage device or medium capable of storing data and/or other computer-readable instructions. For example, storage devices 532 and 534 may represent a magnetic disk drive (e.g., a so-called hard drive), a solid state drive, a floppy disk drive, a magnetic tape drive, an optical disk drive, a flash drive, or the like. Storage interface 530 generally represents any type or form of interface or device for transferring data between storage devices 532 and 534 and other components of computing system 500.

In certain embodiments, storage devices 532 and 534 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 532 and 534 may also include other similar structures or devices for allowing computer software, data, or other computer-readable instructions to be loaded into computing system 500. For example, storage devices 532 and 534 may be configured to read and write software, data, or other computer-readable information. Storage devices 532 and 534 may be a part of computing system 500 or may be separate devices accessed through other interface systems.

Many other devices or subsystems may be connected to computing system 500. Conversely, all of the components and devices illustrated in FIG. 5 need not be present to practice the embodiments described and/or illustrated herein. The devices and subsystems referenced above may also be interconnected in different ways from those shown in FIG. 5. Computing system 500 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable medium. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of apparatus 100 in FIG. 1 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or another remote interface. Various functions described herein may also provide network switching capabilities, gateway access capabilities, network security functions, content caching and delivery services for a network, network control services, and/or and other networking functionality.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a first transistor whose:
        first terminal is electrically coupled directly to an enable node;
        second terminal is electrically coupled directly to a feedback node; and
        third terminal is electrically coupled directly to a ground node;
    a second transistor whose:
        first terminal is electrically coupled directly to the feedback node;
        second terminal is electrically coupled directly to the enable node; and
        third terminal is electrically coupled directly to the ground node;
    a resistor that is electrically coupled directly between the feedback node and the ground node; and
    a diode that is electrically coupled directly between the feedback node and another resistor, wherein the other resistor is electrically coupled directly between the diode and an output-voltage node that provides electrical power to a computing device.

2. The apparatus of claim 1, wherein:
    in response to a reset event, the enable node switches an enable signal that causes the output-voltage node to discontinue providing electrical power to the computing device; and
    the electrical power on the output-voltage node serves as a feedback signal to the feedback node such that, when the electrical power on the output-voltage node drops below a certain threshold, the feedback node causes the enable node to switch back the enable signal, which enables the output-voltage node to restore electrical power to the computing device.

3. The apparatus of claim 1, further comprising a capacitor that is electrically coupled directly between the feedback node and the ground node in parallel with the resistor.

4. The apparatus of claim 3, wherein the resistor and the capacitor form a Resistor-Capacitor (RC) timer whose signal is provided at the feedback node.

5. The apparatus of claim 4, wherein:
    in response to a reset event, the enable node switches an enable signal that causes the output-voltage node to discontinue providing electrical power to the computing device; and
    the RC timer prevents the enable node from switching back the enable signal until the RC timer has expired.

6. The apparatus of claim 1, wherein the first transistor, the second transistor, the resistor, the other resistor, and the diode form at least a portion of a power-reset circuit that uses the electrical power provided by the voltage-output node as a feedback signal to ensure that the electrical power drops below a certain threshold before being restored to the computing device.

7. The apparatus of claim 1, wherein the first transistor, the second transistor, the resistor, and the diode collectively form at least a portion of a power-reset circuit, wherein the power-reset circuit is incorporated in at least one of:
    a front-end power supply of the computing device;
    a Direct Current-to-Direct Current (DC-to-DC) converter of the computing device; and
    a hot swap device of the computing device.

8. The apparatus of claim 1, wherein the computing device comprises at least one of:
    a network device;
    a router;
    a switch; and
    a gateway.

9. A network device comprising:
    a first transistor whose:
        first terminal is electrically coupled directly to an enable node;
        second terminal is electrically coupled directly to a feedback node; and
        third terminal is electrically coupled directly to a ground node;
    a second transistor whose:
        first terminal is electrically coupled directly to the feedback node;
        second terminal is electrically coupled directly to the enable node; and
        third terminal is electrically coupled directly to the ground node;
    a resistor that is electrically coupled directly between the feedback node and the ground node; and
    a diode that is electrically coupled directly between the feedback node and another resistor, wherein the other resistor is electrically coupled directly between the diode and an output-voltage node that provides electrical power to a computing device.

10. The network device of claim 9, wherein:
    in response to a reset event, the enable node switches an enable signal that causes the output-voltage node to discontinue providing electrical power to the computing device; and
    the electrical power on the output-voltage node serves as a feedback signal to the feedback node such that, when the electrical power on the output-voltage node drops below a certain threshold, the feedback node causes the enable node to switch back the enable signal, which enables the output-voltage node to restore electrical power to the computing device.

11. The network device of claim 9, further comprising a capacitor that is electrically coupled directly between the feedback node and the ground node in parallel with the resistor.

12. The network device of claim 11, wherein the resistor and the capacitor form a Resistor-Capacitor (RC) timer whose signal is provided at the feedback node.

13. The network device of claim 12, wherein:
   in response to a reset event, the enable node switches an enable signal that causes the output-voltage node to discontinue providing electrical power to the computing device; and
   the RC timer prevents the enable node from switching back the enable signal until the RC timer has expired.

14. The network device of claim 9, wherein the first transistor, the second transistor, the resistor, the other resistor, and the diode form at least a portion of a power-reset circuit that uses the electrical power provided by the voltage-output node as a feedback signal to ensure that the electrical power drops below a certain threshold before being restored to the computing device.

15. The network device of claim 9, wherein the first transistor, the second transistor, the resistor, and the diode collectively form at least a portion of a power-reset circuit, wherein the power-reset circuit is incorporated in at least one of:
   a front-end power supply of the computing device;
   a Direct Current-to-Direct Current (DC-to-DC) converter of the computing device; and
   a hot swap device of the computing device.

16. The network device of claim 9, wherein the computing device comprises at least one of:
   a network device;
   a router;
   a switch; and
   a gateway.

17. A method comprising:
   electrically coupling:
      a first terminal of a first transistor directly to an enable node;
      a second terminal of the first transistor directly to a feedback node; and
      a third terminal of the first transistor directly to a ground node;
   electrically coupling:
      a first terminal of a second transistor directly to the feedback node;
      a second terminal of the second transistor directly to the enable node; and
      a third terminal of the second transistor directly to the ground node;
   electrically coupling a resistor directly between the feedback node and the ground node; and
   electrically coupling a diode directly between the feedback node and another resistor, wherein the other resistor is electrically coupled directly between the diode and an output-voltage node that provides electrical power to a computing device.

18. The method of claim 17, further comprising:
   detecting a reset event that facilitates resetting the computing device;
   in response to detecting the reset event, switching an enable signal that causes the output-voltage node to discontinue providing electrical power to the computing device; and
   using the electrical power on the output-voltage node as a feedback signal that feeds back to the feedback node such that, when the electrical power on the output-voltage node drops below a certain threshold, the feedback node causes the enable signal to switch back, which enables the output-voltage node to restore electrical power to the computing device.

19. The method of claim 17, further comprising electrically coupling a capacitor directly between the feedback node and the ground node in parallel with the resistor.

20. The method of claim 19, wherein electrically coupling the capacitor directly between the feedback node and the ground node comprises forming, with the resistor and the capacitor, a Resistor-Capacitor (RC) timer whose signal is provided at the feedback node.

* * * * *